(12) United States Patent
Kim et al.

(10) Patent No.: US 12,094,941 B2
(45) Date of Patent: Sep. 17, 2024

(54) SEMICONDUCTOR DEVICES

(71) Applicant: Samsung Electronics Co., Ltd., Suwon-si (KR)

(72) Inventors: Seunggwang Kim, Suwon-si (KR); Sangkoo Kang, Yongin-si (KR); Donghyun Roh, Suwon-si (KR); Koungmin Ryu, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 410 days.

(21) Appl. No.: 17/712,726

(22) Filed: Apr. 4, 2022

(65) Prior Publication Data

US 2023/0080850 A1 Mar. 16, 2023

(30) Foreign Application Priority Data

Sep. 14, 2021 (KR) .......................... 10-2021-0122490

(51) Int. Cl.
*H01L 29/417* (2006.01)
*H01L 29/06* (2006.01)
*H01L 29/10* (2006.01)
*H01L 29/78* (2006.01)

(52) U.S. Cl.
CPC .... *H01L 29/41791* (2013.01); *H01L 29/0649* (2013.01); *H01L 29/1033* (2013.01); *H01L 29/7851* (2013.01)

(58) Field of Classification Search
CPC ....................... H01L 29/0649; H01L 29/41791
See application file for complete search history.

(56) References Cited

U.S. PATENT DOCUMENTS

| | | | |
|---|---|---|---|
| 8,421,166 B2 * | 4/2013 | Chi | H01L 29/665 |
| | | | 257/E21.573 |
| 9,472,644 B2 * | 10/2016 | Sung | H01L 21/76224 |
| 10,418,277 B2 | 9/2019 | Cheng et al. | |
| 10,546,937 B2 | 1/2020 | Singh et al. | |
| 10,727,233 B2 | 7/2020 | Park | |
| 10,854,503 B2 | 12/2020 | Sun et al. | |
| 10,930,655 B2 | 2/2021 | Kim et al. | |
| 11,043,408 B2 | 6/2021 | Chang et al. | |

(Continued)

FOREIGN PATENT DOCUMENTS

| CN | 106601667 A | 4/2017 |
|---|---|---|
| CN | 106803496 A | 6/2017 |

(Continued)

*Primary Examiner* — Douglas M Menz
(74) *Attorney, Agent, or Firm* — Myers Bigel, P.A.

(57) ABSTRACT

A semiconductor device includes a gate structure including a gate electrode, a gate spacer layer on a side surface of the gate electrode, and a gate capping layer on the gate electrode. Moreover, the semiconductor device includes a source/drain region on at least one side of the gate structure, a contact plug on the source/drain region, and first and second insulating films between the contact plug and the gate structure and defining an air gap. The first insulating film includes a first surface, and a second surface extending from the first surface while forming a first angle. The second insulating film includes a third surface forming a second angle with the first surface of the first insulating film. The second angle is an acute angle narrower than the first angle. The air gap is defined by the first surface, the second surface, and the third surface.

20 Claims, 14 Drawing Sheets

(56) References Cited

U.S. PATENT DOCUMENTS

| | | |
|---|---|---|
| 2012/0168899 A1 | 7/2012 | Kim et al. |
| 2012/0276711 A1 | 11/2012 | Yoon et al. |
| 2021/0202712 A1 | 7/2021 | Chen et al. |

FOREIGN PATENT DOCUMENTS

| | | |
|---|---|---|
| KR | 20120078255 A | 7/2012 |
| KR | 20120121795 A | 11/2012 |

* cited by examiner

SEMICONDUCTOR DEVICES

CROSS-REFERENCE TO RELATED APPLICATION(S)

This application claims the benefit under 35 USC 119(a) of Korean Patent Application No. 10-2021-0122490, filed on Sep. 14, 2021 in the Korean Intellectual Property Office, the entire disclosure of which is incorporated herein by reference for all purposes.

BACKGROUND

The present disclosure relates to semiconductor devices. As demand increases for high performance, high speed, and/or multifunctionality in semiconductor devices, the degree of integration of semiconductor devices is increasing. In manufacturing a semiconductor device having a fine pattern corresponding to the trend for high integration of semiconductor devices, patterns having a fine width or a fine separation distance may be implemented. In addition, in order to reduce the limitations of operating characteristics due to the size reduction of planar metal oxide semiconductor FETs, efforts are being made to develop semiconductor devices including FinFETs having a three-dimensional channel structure.

SUMMARY

Example embodiments provide a semiconductor device having improved electrical characteristics.

According to example embodiments, a semiconductor device includes a substrate in which an active region extending in a first direction is defined; a gate structure extending in a second direction while intersecting the active region, on the substrate, the gate structure including a gate electrode, a gate spacer layer on a side surface of the gate electrode, and a gate capping layer on the gate electrode; a source/drain region on the active region, on at least one side of the gate structure; a contact plug on the source/drain region; and first and second insulating films between the contact plug and the gate structure and defining an air gap. The first insulating film includes a first surface, and a second surface extending from the first surface while forming a first angle, the second insulating film includes a third surface forming a second angle with the first surface of the first insulating film, the second angle is an acute angle narrower than the first angle, and the air gap is defined by the first surface, the second surface, and the third surface.

According to example embodiments, a semiconductor device includes an active region extending in a first direction on a substrate; a plurality of channel layers spaced apart from each other vertically on the active region; a gate structure intersecting the active region and the plurality of channel layers, on the substrate, and extending in a second direction, the gate structure surrounding the plurality of channel layers; a source/drain region on the active region, on at least one side of the gate structure, and in contact with the plurality of channel layers; a contact plug electrically connected to the source/drain region; and an air gap structure between the gate structure and the contact plug, and including an air gap. The air gap is defined by a first surface, a second surface, and a third surface of the air gap structure, the first surface and the second surface form a first angle, the first surface and the third surface form a second angle narrower than the first angle, and the second surface and the third surface form a third angle narrower than the second angle.

According to example embodiments, a method of manufacturing a semiconductor device includes forming a structure having an opening, on a substrate; conformally depositing a first insulating film on an upper surface of the structure and a side surface and a lower surface of the opening; conformally depositing a dummy oxide layer on the first insulating film along the upper surface of the structure and the side surface of the opening; conformally depositing a second insulating film on the first insulating film and the dummy oxide layer along the upper surface of the structure and the side and lower surfaces of the opening; depositing an upper oxide layer on the second insulating film to cover the structure and the opening; removing the upper oxide layer until an upper surface of the second insulating film is exposed; removing the second insulating film until an upper surface of the dummy oxide layer is exposed; removing an upper oxide layer and the dummy oxide layer remaining in the opening; and forming an air gap defined by the first and second insulating films by tilting the second insulating film to contact at least a portion of the first insulating film.

A semiconductor device, according to some embodiments, may include a substrate. The semiconductor device may include a gate structure on the substrate. The semiconductor device may include a source/drain region on the substrate and adjacent the gate structure. The semiconductor device may include a contact plug on the source/drain region. Moreover, the semiconductor device may include first and second insulating films that are between the contact plug and the gate structure and that define an air gap. The first insulating film may include first and second surfaces that converge at a first angle. The second insulating film may include a third surface that converges with the first surface of the first insulating film at a second angle. The second angle may be an acute angle narrower than the first angle. The air gap may be defined by the first surface, the second surface, and the third surface.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
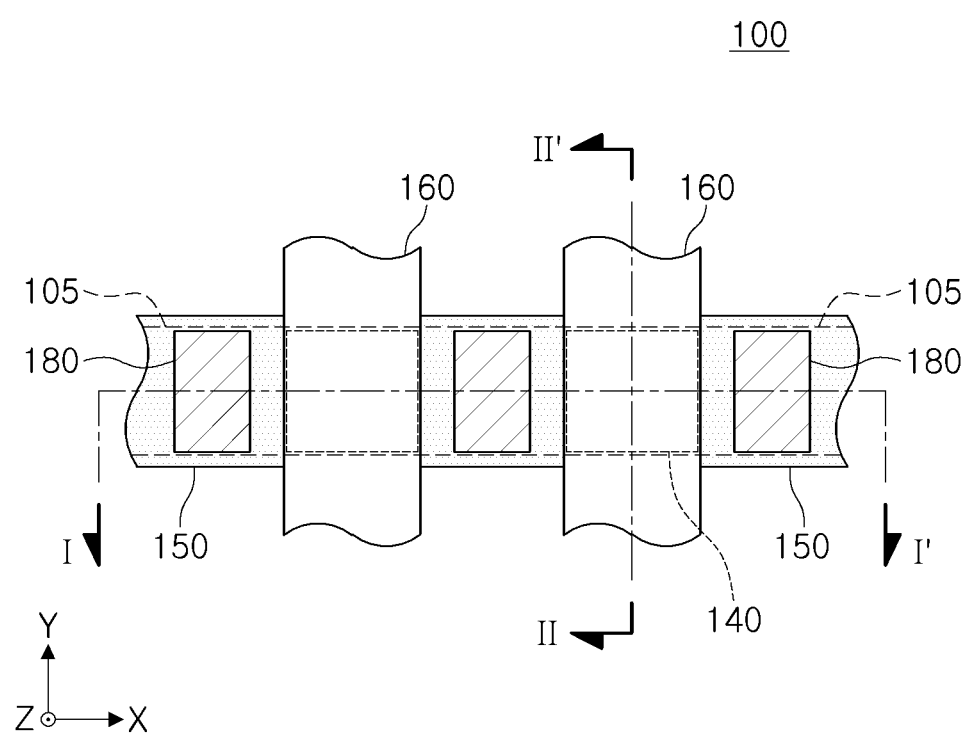
FIG. 1 is an upper plan view illustrating a semiconductor device according to example embodiments.

FIG. 1 is a plan view illustrating a semiconductor device according to example embodiments.

Figure 2A:
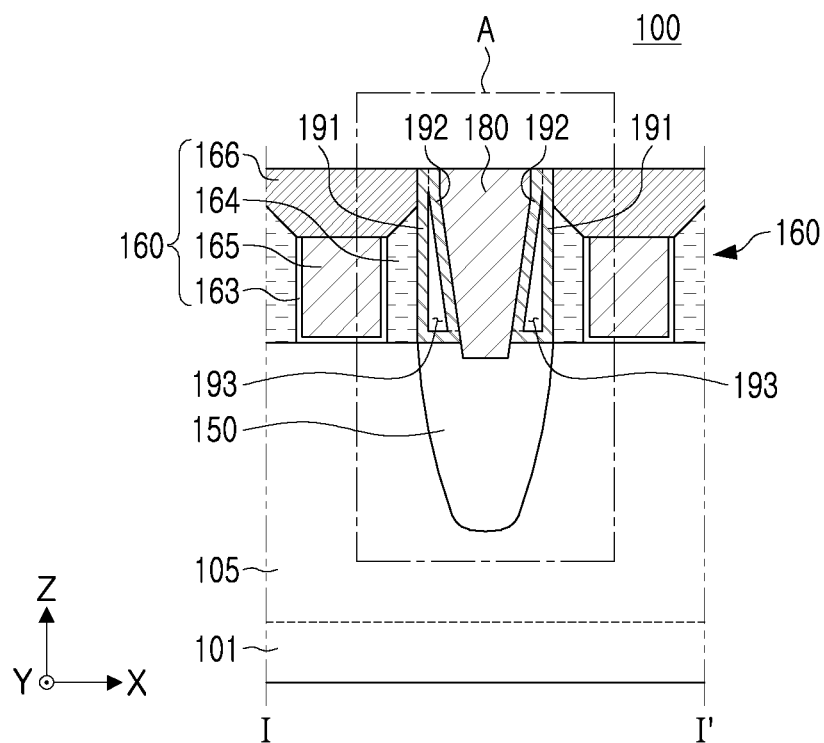
FIGS. 2A and 2B are cross-sectional views illustrating a semiconductor device according to example embodiments.
Figure 2B:
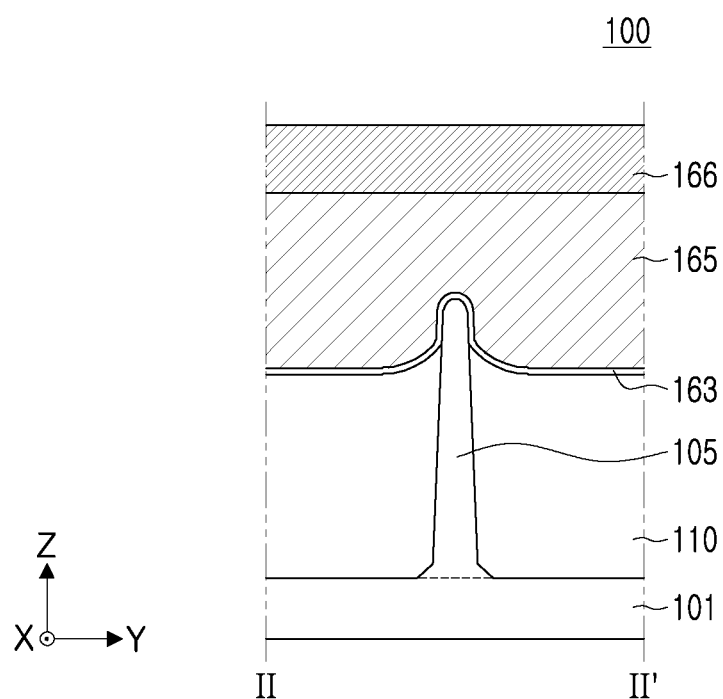

FIGS. 2A and 2B are cross-sectional views illustrating a semiconductor device according to example embodiments. FIGS. 2A and 2B illustrate cross-sections of the semiconductor device of FIG. 1 taken along lines I-I' and respectively.

Figure 3:
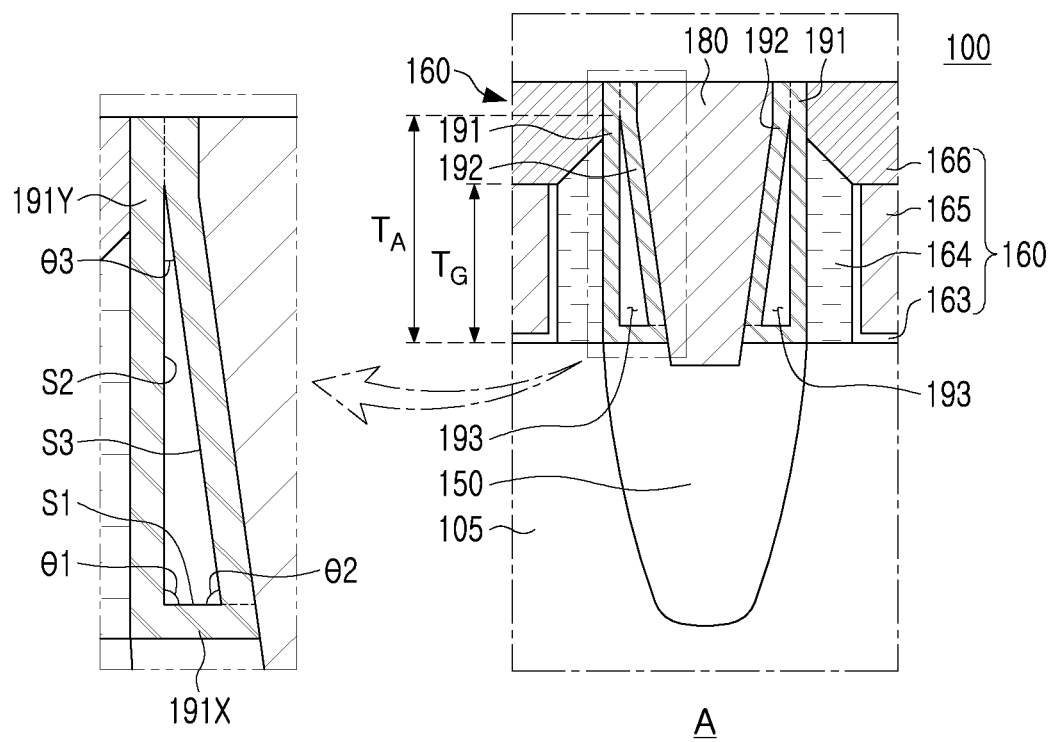
FIG. 3 is a partially enlarged cross-sectional view illustrating a semiconductor device according to example embodiments.

FIG. 3 is a partially enlarged view illustrating a semiconductor device according to example embodiments. FIG. 3 is an enlarged view of an area corresponding to 'A' of FIG. 2A.

For convenience of description, only major components of the semiconductor device may be illustrated in FIGS. 1 to 3. Accordingly, other components of the semiconductor device may be omitted from view for simplicity of illustration.

Referring to FIGS. 1 to 3, a semiconductor device 100 may include a substrate 101, an active region 105 on the substrate 101, a device isolation layer 110, source/drain regions 150, gate structures 160 extending to intersect the active region 105, contact plugs 180 connected (e.g., electrically connected) to the source/drain regions 150, and first and second insulating films 191 and 192. The gate structure 160 may include a gate dielectric layer 163, a gate electrode 165, gate spacer layers 164 and a gate capping layer 166. The semiconductor device 100 may include fin field-effect transistor (FinFET) devices that are transistors in which the active regions 105 have a fin structure. The FinFET devices may include transistors disposed around the active region 105 and gate structures 160 that intersect the active region 105. For example, the transistors may be NMOS transistors or PMOS transistors.

The substrate 101 may have an upper surface extending in the X-direction and the Y-direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

The device isolation layer 110 may define the active region 105 in the substrate 101. The device isolation layer 110 may be formed by, for example, a shallow trench isolation (STI) process. In some embodiments, the device isolation layer 110 may also include a region extending deeper in a lower portion of the substrate 101. The device isolation layer 110 may have a curved upper surface having a higher level as it approaches the active region 105, but the shape of the upper surface of the device isolation layer 110 is not limited thereto. The device isolation layer 110 may be formed of an insulating material. The device isolation layer 110 may be formed of, for example, an oxide, a nitride, or a combination thereof.

The active region 105 is defined by the device isolation layer 110 in the substrate 101 and may be disposed to extend in a first direction, for example, an X-direction. The active region 105 may have a structure protruding from the substrate 101. The upper end of the active region 105 may be disposed to protrude to a predetermined height from the upper surface of the device isolation layer 110. The active region 105 may be formed as a portion of the substrate 101, or may include an epitaxial layer grown from the substrate 101. However, on at least one side of the gate structures 160, the active region 105 on the substrate 101 may be partially recessed, and source/drain regions 150 may be disposed on the recessed active region 105.

The source/drain regions 150 may be disposed on the recess regions in which the active region 105 is recessed, on opposite (in the X-direction) sides of the gate structures 160. The recess region extends in the X-direction between the gate structures 160 and may have inner sidewalls positioned on both (i.e., opposite) ends in the X-direction and a bottom surface between the inner sidewalls. The source/drain regions 150 may serve as a source region or a drain region of the transistors. The upper surfaces of the source/drain regions 150 may be positioned at the same or similar height level as the bottom surfaces of the gate structures 160 as illustrated in FIG. 2A, but the present inventive concept is not limited thereto. The relative heights of the source/drain regions 150 and the gate structures 160 may be variously changed according to example embodiments. For example, the source/drain regions 150 may have an elevated source/drain shape in which upper surfaces are positioned higher than bottom surfaces of the gate structures 160. As an example, the lower surface of the gate electrode 165 may be at a lower level than the upper surfaces of the source/drain regions 150.

As illustrated in FIG. 2A, the source/drain regions 150 have a substantially flat upper surface in cross-section in the X-direction, and may have a curved shape such as a portion of a circle, a portion of an ellipse, or a similar shape thereto downwardly of the upper surface. In another embodiment, the cross-sections of the source/drain regions 150 in the X-direction may have a pentagonal, hexagonal, or similar shape, and may also have any one of polygonal, circular, and rectangular shapes. Cross-sectional shapes of the source/drain regions 150 may be variously changed in example embodiments according to a distance between adjacent gate structures 160, a height of the active region 105, and the like.

The gate structures 160 may be disposed on the active region 105 to intersect the active region 105 and extend in parallel to each other in one direction, for example, the Y-direction. A channel region of a transistor may be formed between the source/drain regions 150 in the active region 105 intersecting the gate structures 160. The gate structure 160 may include a gate dielectric layer 163, a gate electrode 165, gate spacer layers 164, and a gate capping layer 166.

The gate dielectric layer 163 may be disposed between the active region 105 and the gate electrode 165, and may be disposed on (e.g., to cover) the lower surface and opposite (in the X-direction) sides of the gate electrode 165. The gate dielectric layer 163 may include oxide, nitride, or a high-k material. The high-k material may refer to a dielectric material having a higher dielectric constant than that of a silicon oxide layer ($SiO_2$). The high-k material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

The gate electrode 165 may include a conductive material, for example, a metal nitride such as titanium nitride (TiN), tantalum nitride (TaN), or tungsten nitride (WN), and/or a metal material such as aluminum (Al), tungsten (W), or molybdenum (Mo), or a material such as doped polysilicon. The gate electrode 165 may also be formed of two or more multilayer structures. Depending on the configuration of the semiconductor device 100, the gate electrode 165 may also be disposed to be separated between at least some of transistors, adjacent to each other.

The gate spacer layers 164 may be disposed on opposite (in the X-direction) side surfaces of the gate electrode 165. The gate spacer layers 164 may insulate the source/drain regions 150 from the gate electrode 165. The gate spacer layers 164 may have a multilayer structure according to example embodiments. The gate spacer layers 164 may include at least one of a low-k material, an oxide, a nitride, or an oxynitride. The low-k material may refer to a dielectric material having a lower dielectric constant than that of silicon oxide ($SiO_2$).

The gate capping layer 166 may be disposed on the gate electrode 165, and a lower surface thereof may be surrounded by the gate electrode 165 and the gate spacer layers 164.

The contact plug 180 may extend through the first and second insulating films 191 and 192 to be connected to (e.g., electrically connected to and/or in contact with) the source/drain region 150, and may apply an electrical signal to the source/drain region 150. The contact plug 180 may be disposed on the source/drain region 150, and may be disposed to have a longer length in the Y-direction than the source/drain region 150 in some embodiments. The contact plug 180 may have an inclined side in which a lower width is narrower than an upper width according to an aspect ratio, but the configuration is not limited thereto. The contact plug 180 may extend downward into (i.e., protrude downward beyond the upper surface of) the source/drain region 150 to a predetermined depth. However, in some embodiments, the contact plug 180 may be disposed to contact the upper surface of the source/drain region 150 without protruding downward beyond the upper surface of the source/drain region 150.

The first and second insulating films 191 and 192 may be disposed between the gate structure 160 and the adjacent contact plug 180. The first insulating film 191 may include a bottom portion 191X and a vertical portion 191Y. In some embodiments, an upper surface of the bottom portion 191X is referred to as a first surface S1, and a side of the vertical portion 191Y that does not contact the gate structure 160 is referred to as a second surface S2. In addition, the second insulating film 192 is disposed to be inclined toward the first insulating film 191. Hereinafter, a side surface of the second insulating film 192 facing the first insulating film 191 is referred to as a third surface S3. An air gap 193 to be described later may be defined by the first surface S1 of the first insulating film 191, the second surface S2 of the first insulating film 191, and the third surface S3 of the second insulating film 192. As illustrated in FIG. 2A, the first insulating film 191 may be on (e.g., disposed to cover) at least a portion of a side surface of the adjacent gate structure 160 and an upper surface of the source/drain region 150. For example, the first insulating film 191 may be continuously conformally formed along the side surface of the gate structure 160 and the source/drain regions 150. However, the structure of the first insulating film 191 is not limited thereto, and the first insulating film 191 may be disposed to contact the side surface of the gate structure 160 only on the upper portion of the side surface of the gate structure 160 (refer to FIGS. 7A and 7B). Moreover, the air gap 193 and one of the source/drain regions 150 may each be between, in the X-direction, a pair (e.g., adjacent ones) of the gate structures 160, as shown in the cross-sectional view of FIG. 2A.

The second insulating film 192 may be disposed to surround at least a portion of a side surface of the contact plug 180. In addition, the second insulating film 192 may be inclined toward the first insulating film 191 to be in contact with the upper portion of the first insulating film 191. The second insulating film 192 may have a uniform thickness throughout.

As illustrated in FIG. 3, the air gap 193 may refer to an empty space surrounded by the first surface S1 of the first insulating film 191, the second surface S2 of the first insulating film 191, and the third surface S3 of the second insulating film 192. For example, the air gap 193 may indicate a space (e.g., a void) between the first and second insulating films 191 and 192 disposed between the gate structure 160 and the contact plug 180. By replacing the space of the air gap 193 with air having a dielectric constant of 1 instead of a spacer formed of a low-k material, capacitance may be reduced. Accordingly, the RC delay caused by the miniaturization of the device may be inhibited/prevented. The air gap 193 of the structure according to some embodiments may be formed by being surrounded by the first surface S1 of the first insulating film 191, the second surface S2 of the first insulating film 191, and the third surface S3 of the second insulating film 192. As the second insulating film 192 is inclined toward the first insulating film 191, the second insulating film 192 is in contact with the upper portion of the first insulating film 191, and thus, uniform air gaps may be easily formed with a simple process.

The first surface S1 and the second surface S2 of the first insulating film 191 may form (e.g., converge with each other at) a first angle $\theta1$, the first surface S1 of the first insulating film 191 and the third surface S3 of the second insulating film 192 may form a second angle $\theta2$, and the second surface S2 of the first insulating film 191 and the third surface S3 of the second insulating film 192 may form a third angle $\theta3$. Referring to FIG. 3, the first angle $\theta1$ may be substantially 90°, and the second and third angles $\theta2$ and $\theta3$ may be acute angles. In addition, although the third angle $\theta3$ is illustrated to be narrower than the second angle $\theta2$ in FIG. 3, the present inventive concept is not limited thereto. The third angle $\theta3$ may be substantially equal to the second angle $\theta2$ or narrower than the second angle $\theta2$. The air gap 193 may have a triangular structure (e.g., a triangular cross-sectional shape) in which the upper width is narrower than the lower width in the X-Z cross-section.

The air gap 193 may extend in the Z-direction along the adjacent gate structure 160. The upper end of the air gap 193 may be disposed at (e.g., protrude upward to) a level higher than the upper surface of the gate electrode 165 of the gate structure, but the configuration is not limited thereto. Also, the air gap 193 may be disposed at a level lower than the upper surface of the gate capping layer 166 of the gate structure, and higher than the lower surface of the gate capping layer 166. For example, a height TA from the upper surface of the active region 105 to an uppermost portion of the air gap 193 may be greater than a height TG from the upper surface of the active region 105 to the lower surface of the gate electrode 165.

The first and second insulating films 191 and 192 may include the same or different insulating materials. For example, the first and second insulating films 191 and 192 may each include at least one of silicon carbide (SiC), silicon nitride (SiN), silicon oxide (SiO), silicon carbonitride (SiCN), silicon oxycarbide (SiOC), or silicon oxycarbonitride (SiOCN). In an example embodiment, both the first and second insulating films 191 and 192 may include SiOC. Also, the thicknesses of the first insulating film 191 and the second insulating film 192 may be the same or different from each other. The thickness of a portion in which the first and second insulating films 191 and 192 are in contact may be equal to or similar to the sum of respective thicknesses of the first and second insulating films 191 and 192.

FIGS. 4 to 9 illustrate modified examples of the semiconductor device according to the example embodiment of FIGS. 1 to 3. In example embodiments of FIGS. 4 to 9, the same reference numerals as those of FIGS. 1 to 3 indicate corresponding configurations, and a description overlapping with the above description may be omitted. In the example embodiments of FIGS. 4 to 9, in the case of having the same reference numerals as those of FIGS. 1 to 3, but having a different alphabet, it is for describing an example embodiment modified/different from FIGS. 1 to 3, and features described with the same reference numerals as those described above may be the same or similar.

Figure 4:
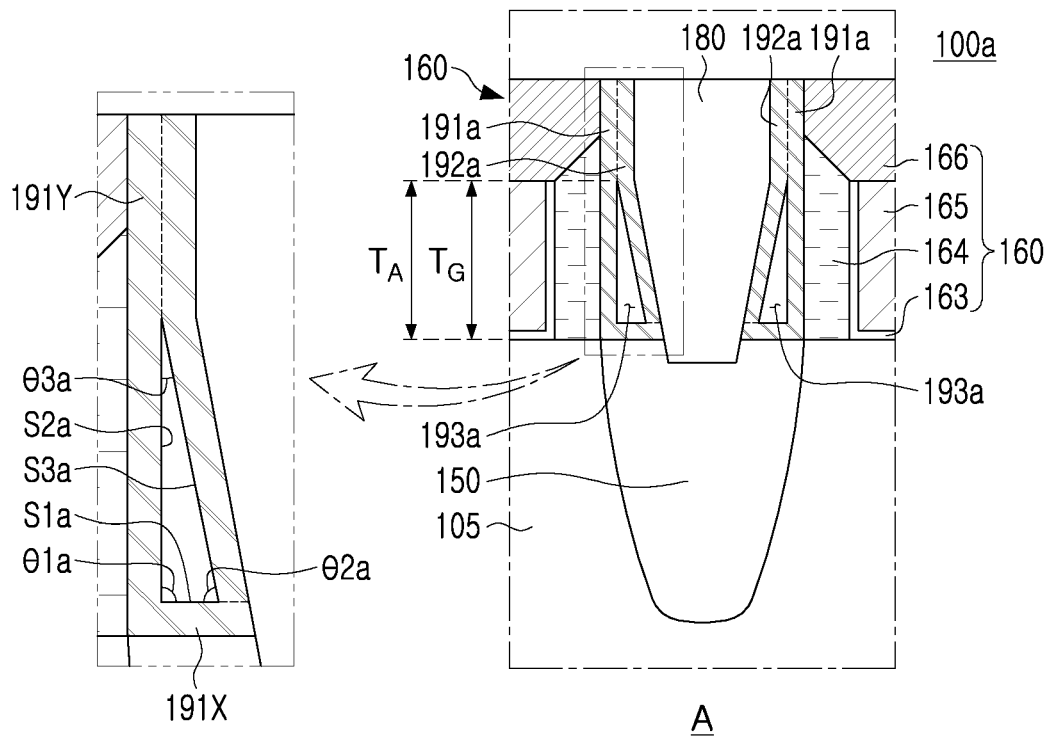
FIGS. 4 and 5 are partially enlarged views illustrating semiconductor devices according to example embodiments.

Referring to FIG. 4, an air gap 193a of a semiconductor device 100a may indicate an empty space surrounded by a first surface S1a of a first insulating film 191a, a second surface S2a of the first insulating film 191a, and a third surface S3a of a second insulating film 192a. In addition, the first surface S1a and the second surface S2a of the first insulating film 191a form a first angle θ1a, and the first surface S1a of the first insulating film 191a and the third surface S3a of the second insulating film 192a form a second angle θ2a. The second surface S2a of the first insulating film 191a and the third surface S3a of the second insulating film 192a form a third angle θ3a. Referring to FIG. 4, the first angle θ1a may be substantially 90°, and the second and third angles θ2a and θ3a may be acute angles. The air gap 193a may have a triangular structure in which the upper width is narrower than the lower width in the X-Z cross-section.

The air gap 193a illustrated in FIG. 4 is different from the air gap 193 of FIG. 3 in that the upper end of the air gap 193a illustrated in FIG. 4 is disposed at the same level as the upper surface of the gate electrode 165 of the gate structure 160. For example, a height TA from the upper surface of the active region 105 to an uppermost portion of the air gap 193a may be the same as a height TG from the upper surface of the active region 105 to the upper surface of the gate electrode 165. The size and shape of the air gap 193a may be determined according to the size and capacitance of the device, and may be changed by controlling the distance between the first and second insulating films 191a and 192a, the thicknesses of the first and second insulating films 191a and 192a, and the like. As illustrated in FIG. 4, the thicknesses of the first and second insulating films 191a and 192a may be the same or similar, but are not limited thereto. Accordingly, the thicknesses of the first and second insulating films 191a and 192a may be different.

Figure 5:
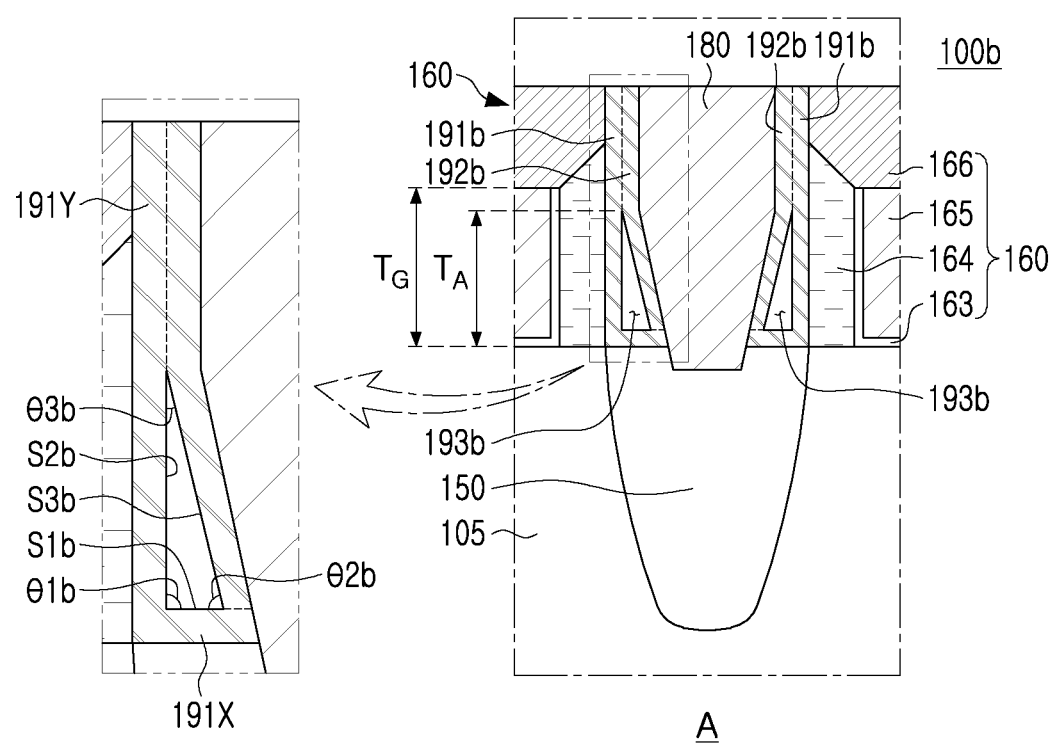

Next, referring to FIG. 5, an air gap 193b of a semiconductor device 100b may indicate an empty space surrounded by a first surface S1b of a first insulating film 191b, a second surface S2b of the first insulating film 191b, and a third surface S3b of a second insulating film 192b. In addition, the first surface S1b of the first insulating film 191b and the second surface S2b of the first insulating film 191b form a first angle θ1b, and the first surface S1b of the first insulating film 191b and the third surface S3b of the second insulating film 192b form a second angle θ2b. The second surface S2b of the first insulating film 191b and the third surface S3b of the second insulating film 192b may form a third angle θ3b. Referring to FIG. 5, the first angle θ1b may be substantially 90°, and the second and third angles θ2b and θ3b may be acute angles. The air gap 193b may have a triangular structure in which the upper width is narrower than the lower width in the X-Z cross-section.

The air gap 193b of FIG. 5 is different from the air gap 193 of FIG. 3 in that the upper end of the air gap 193b illustrated in FIG. 5 is disposed at a lower level than the upper surface of the gate electrode 165 of the gate structure. For example, a height TA from the upper surface of the active region 105 to an uppermost portion of the air gap 193b may be less than a height TG from the upper surface of the active region 105 to the upper surface of the gate electrode 165. Although the Z-direction height of the air gap 193b is greater than the X-direction width in FIG. 5, the present inventive concept is not limited thereto. The Z-direction height of the air gap 193b may be approximately equal to the X-direction width or smaller than the X-direction width.

Figure 6A:
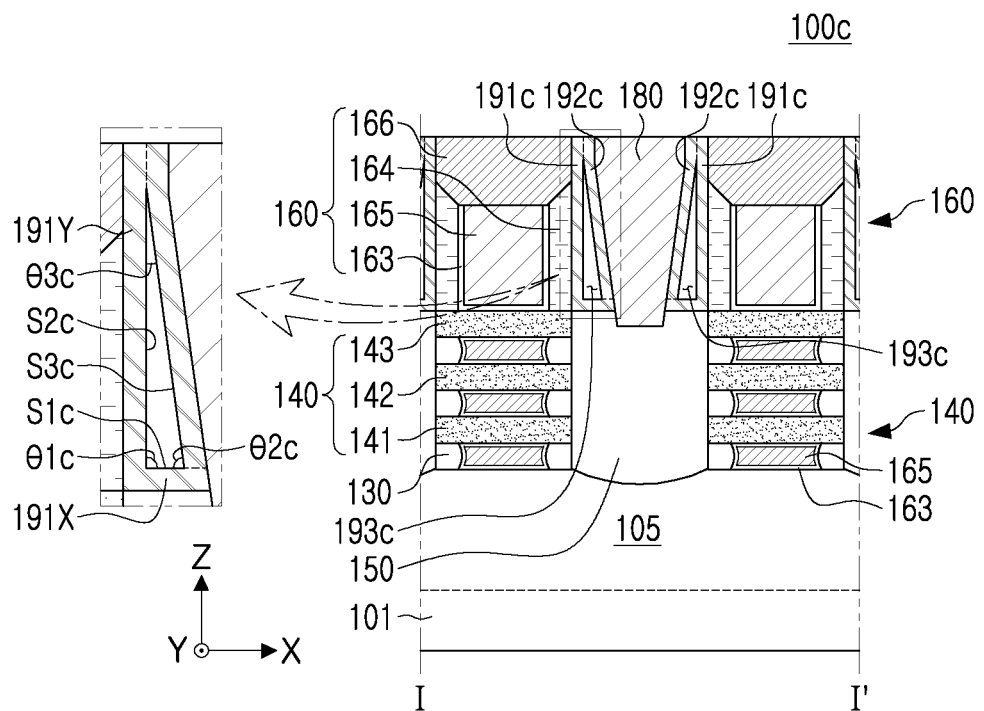
FIGS. 6A and 6B are cross-sectional views illustrating a semiconductor device according to example embodiments.
Figure 6B:
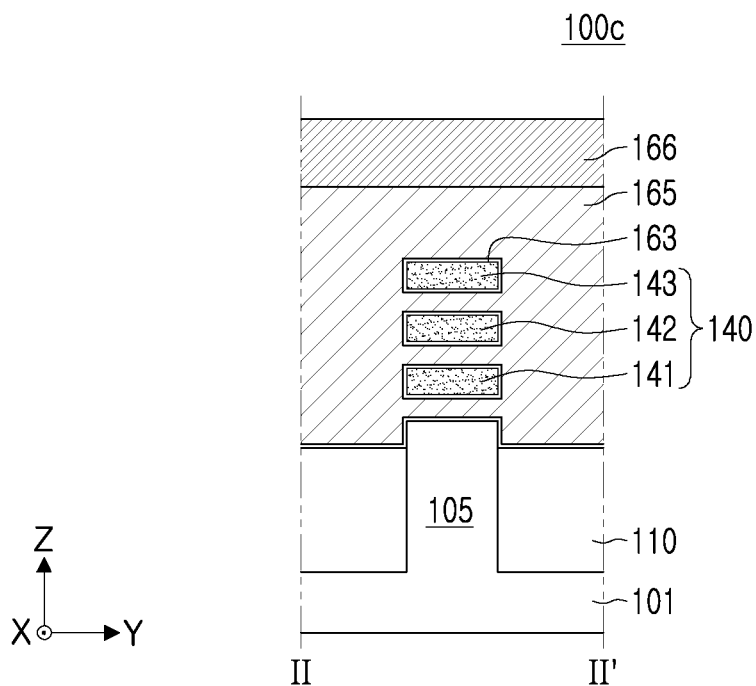

FIGS. 6A and 6B are cross-sectional views illustrating a semiconductor device according to example embodiments. For convenience of description, only major components of the semiconductor device may be illustrated in FIGS. 6A and 6B. Accordingly, other components of the semiconductor device may be omitted from view for simplicity of illustration.

Referring to FIGS. 6A and 6B, a semiconductor device 100c may include channel structures 140 including a plurality of channel layers 141, 142, and 143 that are spaced apart from each other vertically on an active region 105. In the semiconductor device 100c, the active region 105 has a fin structure, and the gate electrode 165 may be disposed between the active region 105 and the channel structure 140, between the plurality of channel layers 141, 142 and 143 of the channel structures 140, and above the channel structure 140. Accordingly, the semiconductor device 100c may be a Multi Bridge Channel FET (MBCFET™) formed by the channel structures 140, the source/drain regions 150, and the gate structures 160.

The gate structure 160 may be disposed above the active region 105 and the channel structures 140, to intersect the active region 105 and the channel structures 140 and to extend in the Y-direction. Channel regions of transistors may be formed in the active region 105 and the channel structures 140 intersecting the gate structure 160. The gate structure 160 may include the gate electrode 165, a gate dielectric layer 163 between the gate electrode 165 and the plurality of channel layers 141, 142 and 143, and gate spacer layers 164 on side surfaces of the gate electrode 165, and a gate capping layer 166 on upper surfaces of the gate electrode 165 and the gate spacer layers 164. The gate electrode 165 may be disposed above the active region 105 in (e.g., to fill) a space between the plurality of channel layers 141, 142, and 143 and extend upwardly of the channel structure 140. The gate electrode 165 may surround the plurality of channel layers 141, 142, and 143. The gate electrode 165 may be spaced apart from the plurality of channel layers 141, 142, and 143 by the gate dielectric layer 163.

First and second insulating films 191c and 192c may be disposed between adjacent gate structures 160. An air gap 193c may be defined by a first surface S1c of the first insulating film 191c, a second surface S2c of the first insulating film 191c, and a third surface S3c of the second insulating film 192c. Although the upper end of the air gap 193c is illustrated to be disposed at a higher level than the upper surface of the gate electrode 165 in FIGS. 6A and 6B, as described in the example embodiments of FIGS. 3 to 5, the height, width, shape and the like of the air gap 193c are not limited thereto.

The first surface S1c of the first insulating film 191c and the second surface S2c of the first insulating film 191c may form a first angle θ1c, the first surface S1c of the first insulating film 191c and the third surface S3c of the second insulating film 192c may form a second angle θ2c, and the second surface S2c of the first insulating film 191c and the third surface S3c of the second insulating film 192c may form a third angle θ3c. Referring to FIGS. 6A and 6B, the first angle θ1c may be substantially 90°, and the second and third angles θ2c and θ3c may be acute angles. The air gap 193c may have a triangular structure in which the upper width is narrower than the lower width in the X-Z cross-section.

A contact plug 180 may be connected (e.g., electrically connected) to the source/drain region 150 by penetrating through the first and second insulating films 191c and 192c, and may apply an electrical signal to the source/drain region 150.

Inner spacer layers 130 may be disposed between the channel structures 140 in parallel with (e.g., at a vertical level of) the gate electrode 165. Below the third channel layer 143, the gate electrode 165 may be spaced apart from the source/drain regions 150 by the inner spacer layers 130 to be electrically isolated from each other. The inner spacer layers 130 may have a shape in which a side facing the gate electrode 165 is convexly rounded inwardly toward the gate electrode 165, but the configuration is not limited thereto. The inner spacer layers 130 may be formed of oxide, nitride, or oxynitride. For example, the inner spacer layers 130 may comprise a low-k film.

The channel structure 140 may include the first to third channel layers 141, 142 and 143 that collectively are a plurality (i.e., two or more) of channel layers, which are spaced apart from each other in a direction perpendicular to the upper surface of the active region 105, for example, in the Z-direction, on the active region 105. The first to third channel layers 141, 142, and 143 may be spaced apart from the upper surface of the active region 105 while being connected (e.g., electrically connected) to the source/drain region 150. The first to third channel layers 141, 142, and 143 may have the same or similar width as the active region 105 in the Y-direction, and may have the same or similar width as the gate structure 160 in the X-direction. However, in some embodiments, the first to third channel layers 141, 142, and 143 may also have a reduced width such that side surfaces of the gate structure 160 are positioned in the X-direction.

The first to third channel layers 141, 142, and 143 may be formed of a semiconductor material, and may include, for example, at least one of silicon (Si), silicon germanium (SiGe), or germanium (Ge). The first to third channel layers 141, 142, and 143 may be formed of, for example, the same material as the substrate 101. In some embodiments, the first to third channel layers 141, 142, and 143 may include an impurity region positioned in a region adjacent to the source/drain region 150. The number and shape of the channel layers 141, 142, and 143 constituting one channel structure 140 may be variously changed in example embodiments. For example, in some embodiments, the channel structure 140 may further include a channel layer disposed on the upper surface of the active region 105.

Next, FIGS. 7A to 9 are cross-sectional views illustrating semiconductor devices according to example embodiments. Example embodiments illustrated in FIGS. 7A to 9 are different from the example embodiments of FIGS. 2A-6A in the shape and number of air gaps.

Figure 7A:
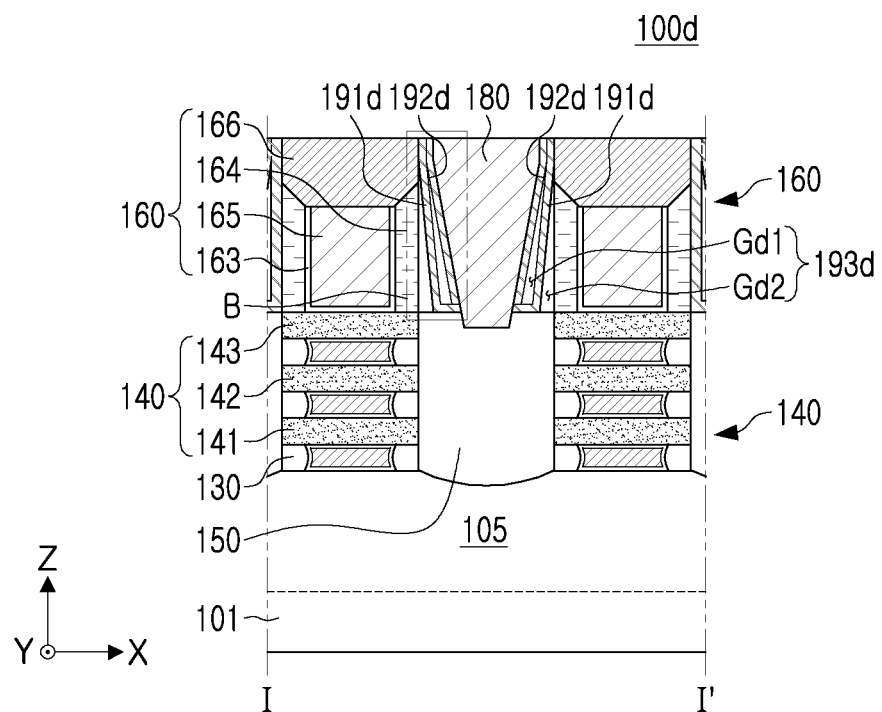
FIGS. 7A, 7B, 8A, 8B, and 9 are cross-sectional views illustrating semiconductor devices according to example embodiments.
Figure 7B:
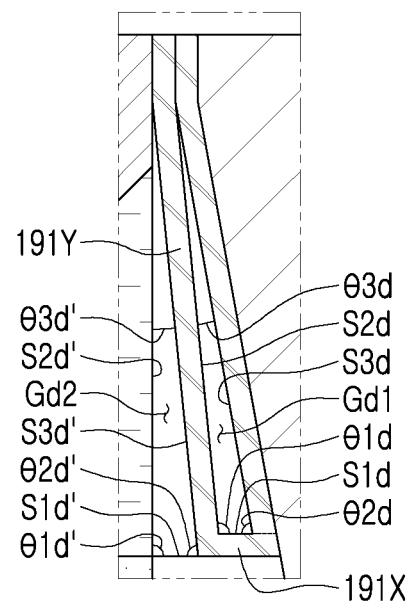

Referring to FIGS. 7A and 7B, a semiconductor device 100d is different from that of the example embodiment illustrated in FIGS. 6A and 6B in that the semiconductor device 100d includes first and second air gaps Gd1 and Gd2. FIG. 7B is an enlarged view of an area B of FIG. 7A.

An air gap structure 193d illustrated in FIGS. 7A and 7B may include first and second air gaps Gd1 and Gd2 and first and second insulating films 191d and 192d. The first air gap Gd1 may be defined by a first surface S1d of the first insulating film 191d, a second surface S2d of the first insulating film 191d, and a third surface S3d of the second insulating film 192d. The first surface Sid of the first insulating film 191d and the second surface S2d of the first insulating film 191d may form a first angle θ1d, the first surface S1d of the first insulating film 191d and the third surface S2d of the second insulating film 192d may form a second angle θ2d, and the second surface S2d of the first insulating film 191d and the third surface S3d of the second insulating film 192d may form a third angle θ3d. Referring to FIGS. 7A and 7B, the first angle θ1d may be an obtuse angle, and the second and third angles θ2d and θ3d may be acute angles.

The second air gap Gd2 may be disposed between the first air gap Gd1 and the gate structure 160. The first air gap Gd1 and the second air gap Gd2 may each be between the gate structure 160 and the contact plug 180. The second air gap Gd2 may be defined by a fourth surface S1d', a fifth surface S2d', and a sixth surface S3d' of the first insulating film 191d illustrated in FIG. 7A. The fourth surface S1d' may be a upper surface of the source/drain region 150, and the fifth surface S2d' may be a side surface of the gate structure 160. The sixth surface S3d' of the first insulating film 191d may be another surface of the first insulating film 191d, opposing the second surface S2d. The fourth surface S1d' and the fifth surface S2d' may form a fourth angle θ1d', and the fourth surface S1d' and the sixth surface S3d' of the first insulating film 191d may form a fifth angle θ2d'. The fifth surface S2d' and the sixth surface S3d' of the first insulating film 191d may form a third angle θ3d'. Referring to FIG. 7B, the fourth angle θ1d' may be substantially 90°, and the fifth and sixth angles θ2d' and θ3d' may be acute angles. As illustrated in FIGS. 7A and 7B, the third angle θ3 may be smaller than the second angle θ2, and the sixth angle θ3' may be smaller than the fifth angle θ2', but are not limited thereto. The relative size of the angle may be formed differently from what is shown in FIGS. 7A and 7B. The first and second air gaps Gd1 and Gd2 may have a triangular structure in which the upper width is narrower than the lower width in the X-Z cross-section.

Only an upper portion of the first insulating film 191d may be in contact with the gate structure 160, and the remaining portions of the first insulating film 191d may not contact the side surface of the gate structure 160. Accordingly, the air gap structure illustrated in FIGS. 7A and 7B may include a plurality of air gaps 193d including the first and second air gaps Gd1 and Gd2.

In the example embodiment illustrated in FIGS. 7A and 7B, each of the first and second air gaps Gd1 and Gd2 may have a triangular shape in which an upper width is narrower than a lower width, but the configuration is not limited thereto. The shape and size of the first and second air gaps Gd1 and Gd2 may be controlled by changing the thickness, position, number, spacing, material, or the like of the first and second insulating films 191d and 192d.

Figure 8A:
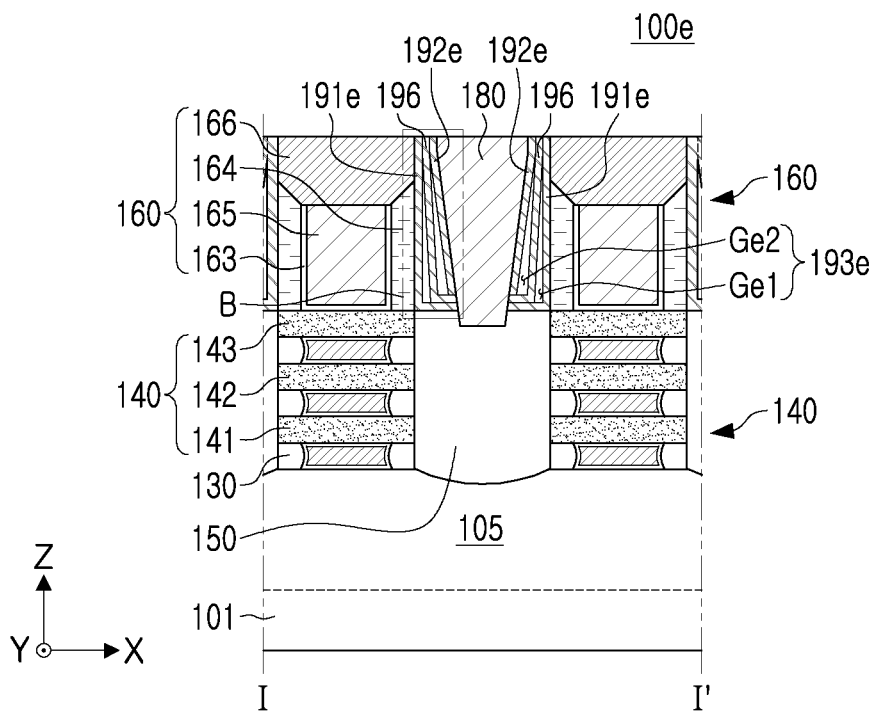
Figure 8B:
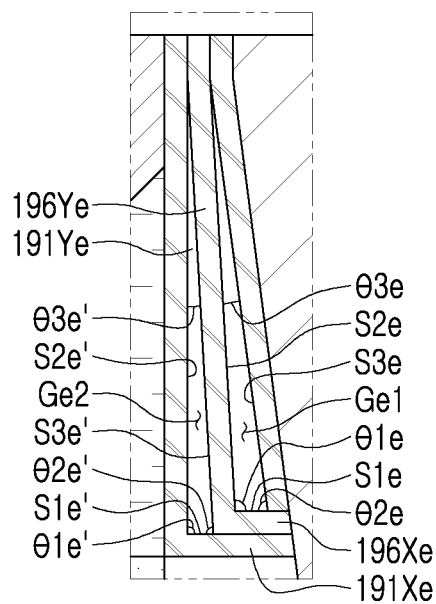

Next, referring to FIGS. 8A and 8B, a semiconductor device 100e is different from that of the example embodiment illustrated in FIGS. 6A and 6B in that an air gap structure 193e of the semiconductor device 100e includes first and second air gaps Ge1 and Ge2. In addition, the example embodiment illustrated in FIGS. 8A and 8B is different from the example embodiment illustrated in FIGS. 7A and 7B in that the air gap structure 193e further includes a third insulating film 196 between the first and second insulating films 191e and 192e. FIG. 8B is an enlarged view of an area B of FIG. 8A.

The third insulating film 196 may include a bottom portion 196Xe and a vertical portion 196Ye. In some embodiments, the upper surface of the bottom portion 196Xe is referred to as a first surface S1e, and a side surface of the vertical portion 196Ye that faces the second insulating film 192e, among a plurality of side surfaces of the vertical portion 196Ye, is referred to as a second surface S2e. Also, a side surface of the second insulating film 192e facing the third insulating film 196, among a plurality of side surfaces of the second insulating film 192e, is referred to as a third surface S3e. In addition, the upper surface of the bottom portion 191Xe of the first insulating film 191e is referred to as a fourth surface S1e', and a side surface of the vertical portion 191Ye facing the third insulating film 196, among a plurality of side surfaces of the vertical portion 191Ye of the first insulating film 191e, is referred to as a fifth surface S2e'. Another side surface of the third insulating film 196, opposing the second surface S2e, is referred to as a sixth surface S3e'.

The first air gap Ge1 may be defined by the first surface S1e of the third insulating film 196, the second surface S2e of the third insulating film 196, and the third surface S3e of the second insulating film 192e. The first surface S1e and the second surface S2e of the third insulating film 196 may form a first angle θ1e, and the first surface S1e of the third insulating film 196 and the third surface S3e of the second insulating film 192e may form a second angle θ2e. The third surface S3e of the second insulating film 192e may form a third angle θ3e with the second surface S2e of the third insulating film 196. Referring to FIGS. 8A and 8B, the first angle θ1e may be an obtuse angle, and the second and third angles θ2e and θ3e may be acute angles.

The second air gap Ge2 may be defined by a fourth surface S1e' of the first insulating film 191e, a fifth surface S2e' of the first insulating film 191e, and a sixth surface S3e' of the third insulating film 196. The fourth surface S1e' of the first insulating film 191e and the fifth surface S2e' of the first insulating film 191e may form a first angle θ1e', and the fourth surface S1e' of the first insulating film 191e and the sixth surface S3e' of the third insulating film 196 may form a second angle θ2e'. The fifth surface S2e' of the first insulating film 191e and the sixth surface S3e' of the third insulating film 196 may form a third angle θ3e'. Referring to FIGS. 8A and 8B, the first angle θ1e' may be substantially 90°, and the second and third angles θ2e' and θ3e' may be acute angles.

Although three insulating films are illustrated in FIGS. 8A and 8B, the number of insulating films is not limited thereto, and the number of air gaps may be increased by increasing the number of insulating films.

In addition, in the example embodiment of FIGS. 8A and 8B, the first angle θ1e' between a side/second surface S2e' of the first insulating film 191e and the first surface S1e' of the first insulating film 191e is substantially 90°, but is not limited thereto, and the first angle θ1e' may be an obtuse angle. Moreover, in some embodiments, as illustrated in FIGS. 7A and 7B, an additional air gap may be disposed between the first insulating film and the gate structure 160.

Figure 9:
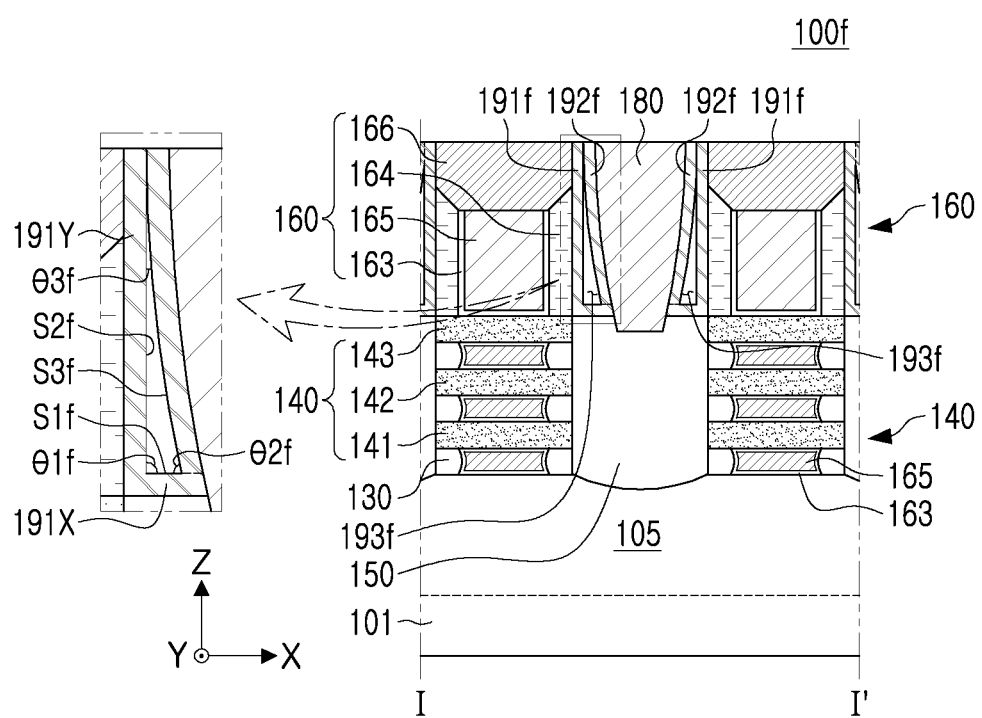

Next, referring to an example embodiment of FIG. 9, an air gap 193f of a semiconductor device 100f is different from that of the example embodiment illustrated in FIGS. 6A and 6B in that at least one of the three surfaces defining the air gap 193f has a curved shape. The air gap 193f may indicate an empty space surrounded by a first surface S1f of a first insulating film 191f, a second surface S2f of the first insulating film 191f, and a third surface S3f of a second insulating film 192f In addition, the first surface S1f and the second surface S2f of the first insulating film 191f may form a first angle θ1f, and the first surface S1f of the first insulating film 191f and the third surface S3f of the second insulating film 192f may form a second angle θ2b. The second surface S2f of the first insulating film 191f and the third surface S3f of the second insulating film 192f may form a third angle θ3f Referring to FIG. 5, the first angle θ1b may be substantially 90°, and the second and third angles θ2b and θ3b may be acute angles. The example embodiment of FIG. 9 is different from the example embodiment of FIGS. 6A and 6B in that the third surface S3f of the second insulating film 192f among the plurality of surfaces defining the air gap 193f has a curved shape that is convex downwardly/diagonally toward the first insulating film 191f When the second insulating film is inclined toward the first insulating film, the second insulating film may maintain a planar shape to form an air gap as illustrated in FIGS. 6A and 6B, or the second insulating film may have a curved surface shape inclined convexly toward the first insulating film to form an air gap as illustrated in FIGS. 8A and 8B. The shape of the second insulating film 192f is not limited thereto, and the curvature, inclination and the like may be changed differently from the example embodiment illustrated in FIGS. 8A and 8B.

FIGS. 10A to 10L are views illustrating a process sequence to illustrate a method of manufacturing the semiconductor device 100 illustrated in FIGS. 1 to 3. An example embodiment of a method of manufacturing the semiconductor device 100 of FIGS. 1 to 3 will be described with reference to FIGS. 10A to 10L.

Figure 10A:
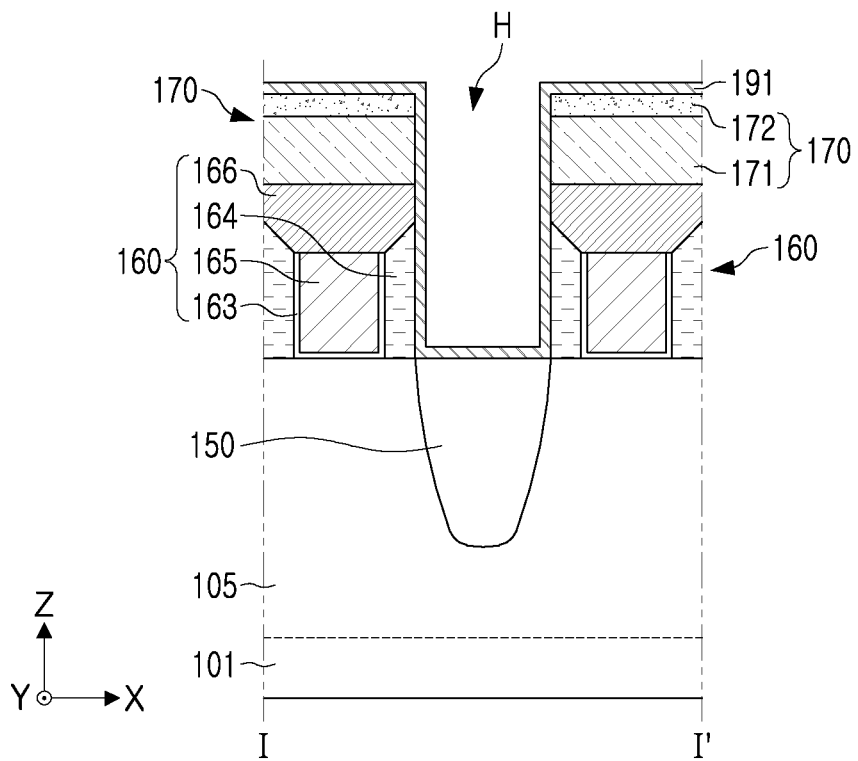
FIGS. 10A to 10K are diagrams illustrating a process sequence to illustrate a method of manufacturing a semiconductor device according to example embodiments.

Referring to FIG. 10A, a trench defining the active region 105 may be formed to extend in the X-direction by patterning the substrate 101. Next, a process of filling the trench with an insulating material and removing a portion of the insulating material such that the active region 105 protrudes upwardly of the substrate 101 may be performed. Accordingly, the device isolation layer 110 (FIG. 2B) may be formed.

Next, a plurality of gate structures 160 intersecting the active region 105 and extending in the Y-direction may be formed to be spaced apart from each other, and a plurality of sacrificial layers 170 may be formed on the plurality of gate structures 160. The plurality of gate structures 160 may include a gate dielectric layer 163, a gate electrode 165, gate spacer layers 164, and a gate capping layer 166 as described above with reference to FIGS. 1 to 3. In addition, the sacrificial layer 170 may be configured as a single layer or may include a plurality of layers 171 and 172 as illustrated in FIG. 10A. For example, the sacrificial layer 171 may include a material such as, for example, tetra ethyl ortho silicate (TEOS), phosphor silicate glass (PSG), boro-phosphor silicate glass (BPSG), undoped silicate glass (USG), or plasma enhanced-TEOS (PE-TEOS), high density plasma-chemical vapor deposition (HDP-CVD) oxide, or the like. The sacrificial layer 172 may include, for example, a material such as titanium nitride (TiN), tantalum nitride (TaN), titanium aluminum nitride (TiAlN), tungsten silicon nitride (WSiN), or tantalum silicon nitride (TaSiN).

Next, an interlayer insulating layer covering the source/drain regions 150 and the device isolation layer 110 may be formed, and an opening H penetrating through the interlayer insulating layer may be formed on the source/drain regions 150. The shape of the opening H is not limited and may be, for example, a trench shape or a circular shape. The interlayer insulating layer may include, for example, at least one of an oxide, a nitride, or an oxynitride, and may include a low-k material.

Next, on at least one side of the plurality of gate structures 160, a recess may be formed by selectively removing the active region 105 and the source/drain region 150 may be formed in the recessed active region 105.

The first insulating film 191 may cover the upper surface of the sacrificial layer 170 and the side and lower surfaces of the opening H, and may be formed to be substantially conformal. The first insulating film 191 may include a low-k material, for example, at least one of silicon carbide (SiC), silicon nitride (SiN), silicon oxide (SiO), silicon carbonitride (SiCN), silicon oxycarbide (SiOC), or silicon oxycarbonitride (SiOCN).

Figure 10B:
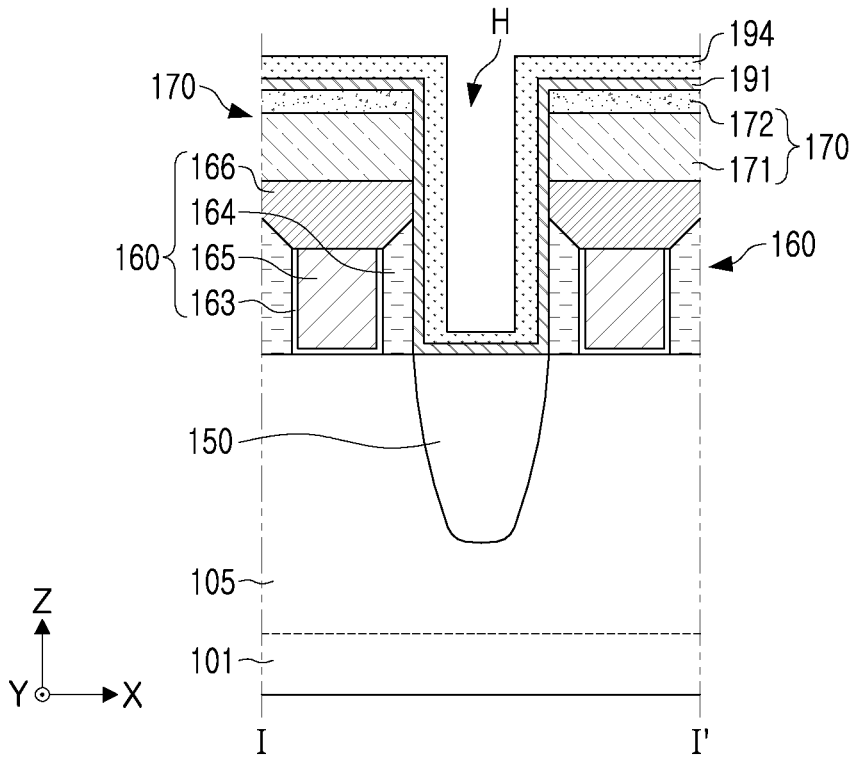

Referring to FIG. 10B, a dummy oxide layer 194 may be formed to cover the first insulating film 191, and may be formed to be substantially conformal. The thickness of the dummy oxide layer 194 may be smaller on the lower surface of the opening H than on the upper surface of the sacrificial layer 170 and the side surface of the opening H, but the configuration is not limited thereto. The dummy oxide layer 194 may be formed to have a substantially uniform thickness throughout. The dummy oxide layer 194 may include silicon oxide ($SiO_2$), aluminum oxide ($Al_2O_3$), tantalum oxide ($Ta_2O_3$), titanium oxide ($TiO_2$), or the like.

Figure 10C:
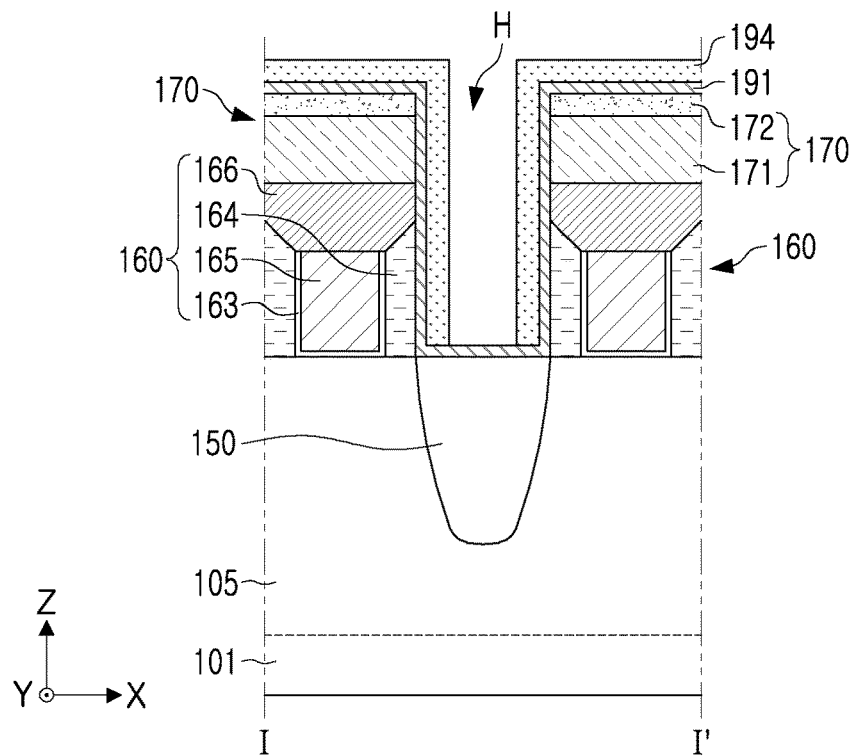

Referring to FIG. 10C, the dummy oxide layer 194 formed on the lower surface of the opening H may be removed by etching. For example, the dummy oxide layer 194 is not substantially deposited on the lower surface of the dummy hole H, and thus the first insulating film 191 may be exposed. In the etching process, a portion of the dummy oxide layer 194 formed on the side surface of the opening H and the upper surface of the sacrificial layer 170 may be etched together, such that the thickness may be smaller than in FIG. 10B. By controlling the thickness of the dummy oxide layer 194 to control the spacing between the first and second insulating films 191 and 192, the size and shape of the air gap 193 to be described later may be controlled.

Figure 10D:
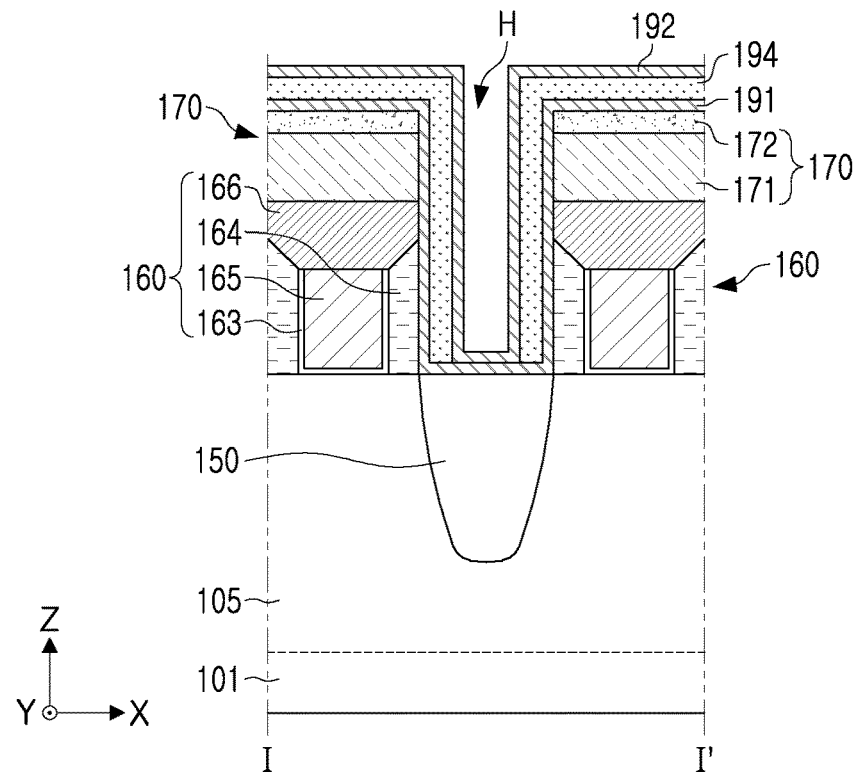

Referring to FIG. 10D, the second insulating film 192 may be formed to cover the dummy oxide layer 194 and the first insulating film 191, and may be formed substantially conformally. The second insulating film 192 may overlap the first insulating film 191 on the lower surface of the opening H. The second insulating film 192 may include a low-k material, for example, at least one of silicon carbide (SiC), silicon nitride (SiN), silicon oxide (SiO), silicon carbonitride (SiCN), silicon oxycarbide (SiOC), or silicon oxycarbonitride (SiOCN). The second insulating film 192 may include the same or different material from the first insulating film 191. In addition, the second insulating film 192 may have the same or different thickness as the first insulating film 191.

Figure 10E:
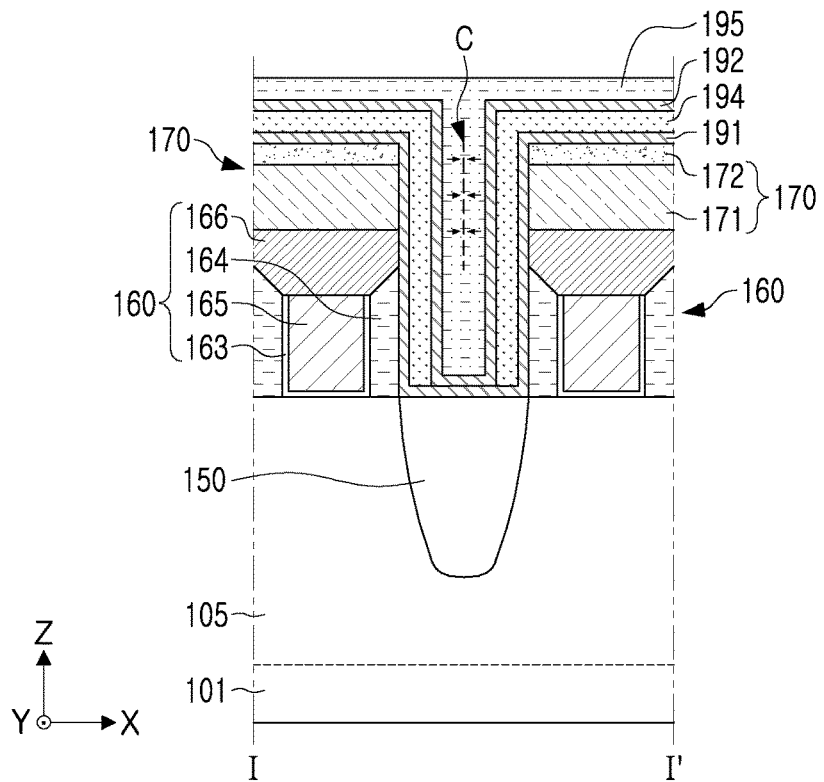

Referring to FIG. 10E, an upper oxide layer 195 may be formed to cover the first and second insulating films 191 and 192 and the dummy oxide layer 194. The upper oxide layer 195 may be formed to fill the inside of the opening and to cover the second insulating film 192 to a level higher than that of the uppermost surface of the second insulating film 192. Stress may act on the upper oxide layer 195 filling the inside of the opening between the opposite side surfaces of the second insulating film 192 by the inner wall of the opening. For example, as illustrated in FIG. 10E, a compressive stress may act toward a center C of the upper oxide layer 195 filling the inside of the opening.

Figure 10F:
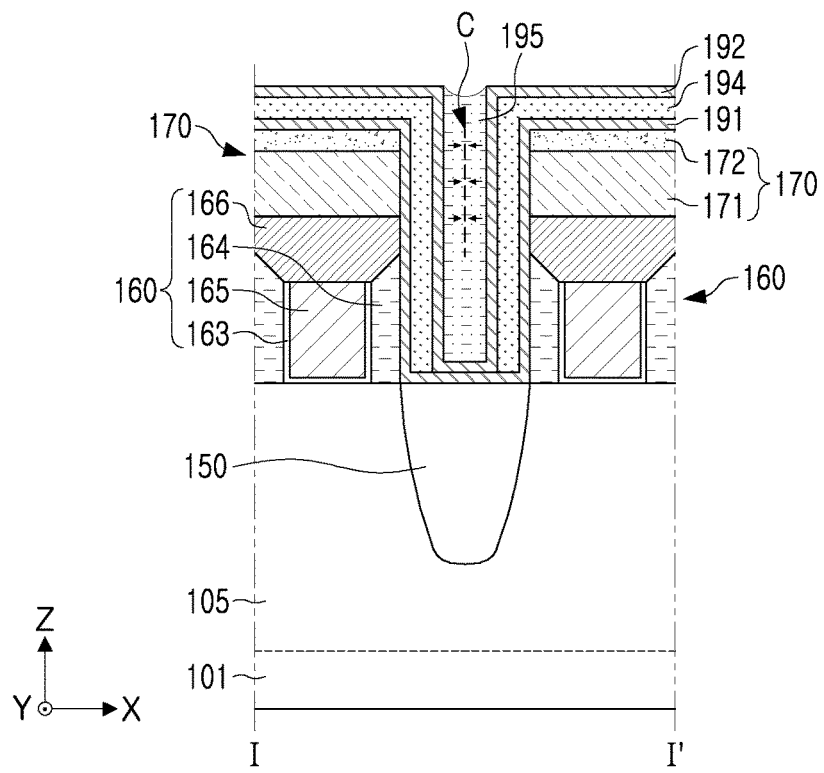

Referring to FIG. 10F, the upper oxide layer 195 may be planarized by, for example, chemical mechanical polishing (CMP), until the upper surface of the second insulating film 192 is exposed. As a result, only portions of the upper oxide layer 195 that fill the inside of the opening may remain. The upper surface of the remaining upper oxide layer 195 may have a downwardly recessed shape, but the shape thereof is not limited thereto. For example, the upper surface of the remaining upper oxide layer 195 may be substantially coplanar with the upper surface of the second insulating film 192. A compressive stress toward the center C may remain in the remaining upper oxide layer 195. Thereafter, the exposed upper surface of the second insulating film 192 may be oxidized using an oxygen plasma (02 plasma). In an example embodiment, the second insulating film 192 may include silicon oxycarbide (SiOC), and the silicon oxycarbide (SiOC) of the second insulating film 192 may be oxidized to silicon oxide ($SiO_2$) by oxygen plasma. In this process, not only the upper surface of the second insulating film 192 but also a portion of silicon oxycarbide (SiOC) included in the upper side surface adjacent to the upper surface is oxidized to silicon oxide ($SiO_2$), and thus, the side surface of the second insulating film 192 may have a relatively higher oxygen concentration in the upper portion than the oxygen concentration in the lower portion.

Figure 10G:
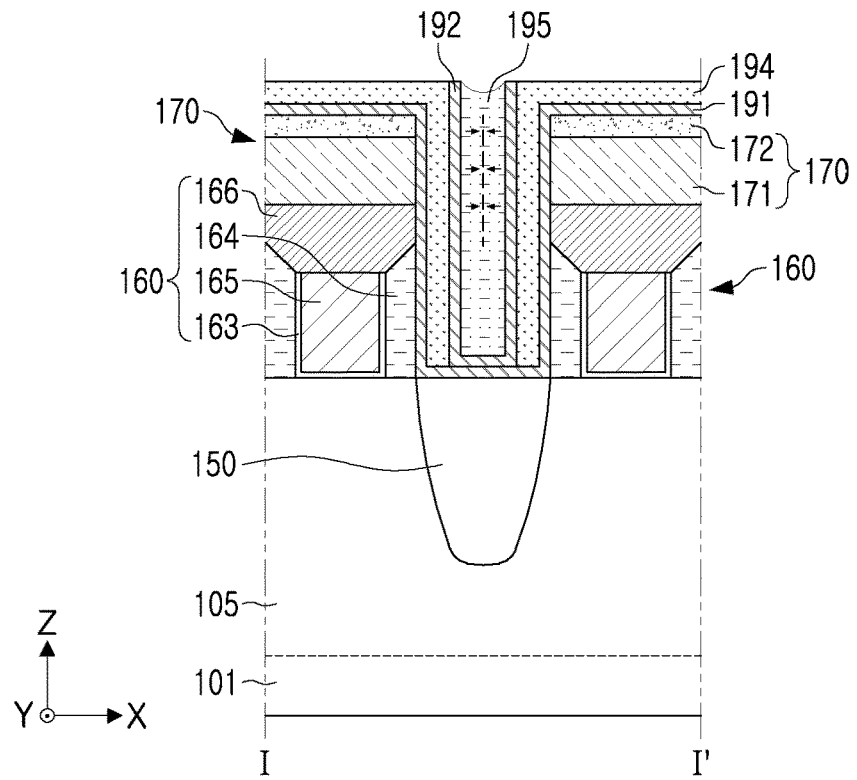

Referring to FIG. 10G, the upper surface of the second insulating film 192 may be etched. The upper surface of the second insulating film 192 may be removed by a wet etching process, for example, by dilute hydrofluoric acid (DHF). In the process illustrated in FIG. 10F, the upper surface of the second insulating film 192 is oxidized by oxygen plasma, and thus the oxidized upper surface of the second insulating film 192 may be selectively removed by DHF. For example, as illustrated in FIG. 10G, a structure in which the upper surface of the second insulating film 192 is completely removed may be implemented. Accordingly, the upper surface of the dummy oxide layer 194 may be exposed.

Figure 10H:
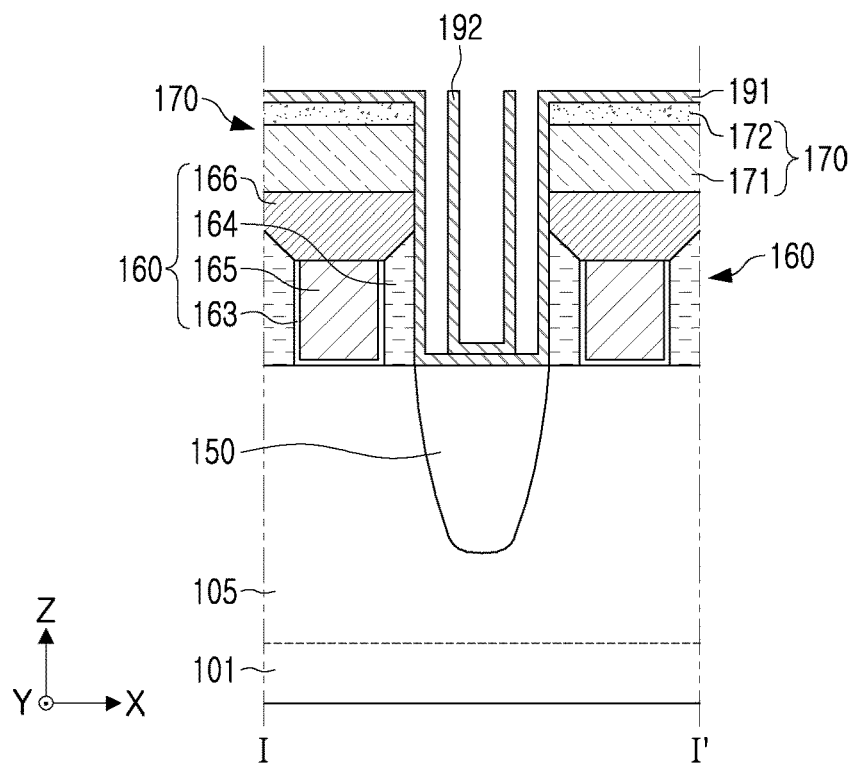

Referring to FIG. 10H, the upper oxide layer 195 filling the inside of the opening between the side surfaces of the second insulating film 192 and the dummy oxide layer 194 between the first and second insulating films 191 and 192 may be removed by etching. The upper oxide layer 195 and the dummy oxide layer 194 may be removed by a wet etching process, for example, by dilute hydrofluoric acid (DHF). As a result, side surfaces of the first and second insulating films 191 and 192 may remain inside the opening H in a fin shape. Due to the removal of the upper oxide layer 195 filling the inside of the opening H, the stress existing inside the opening H may be relieved. Accordingly, the stress acting on the side surfaces of the first and second insulating films 191 and 192 remaining inside the opening H may also be relieved.

Figure 10I:
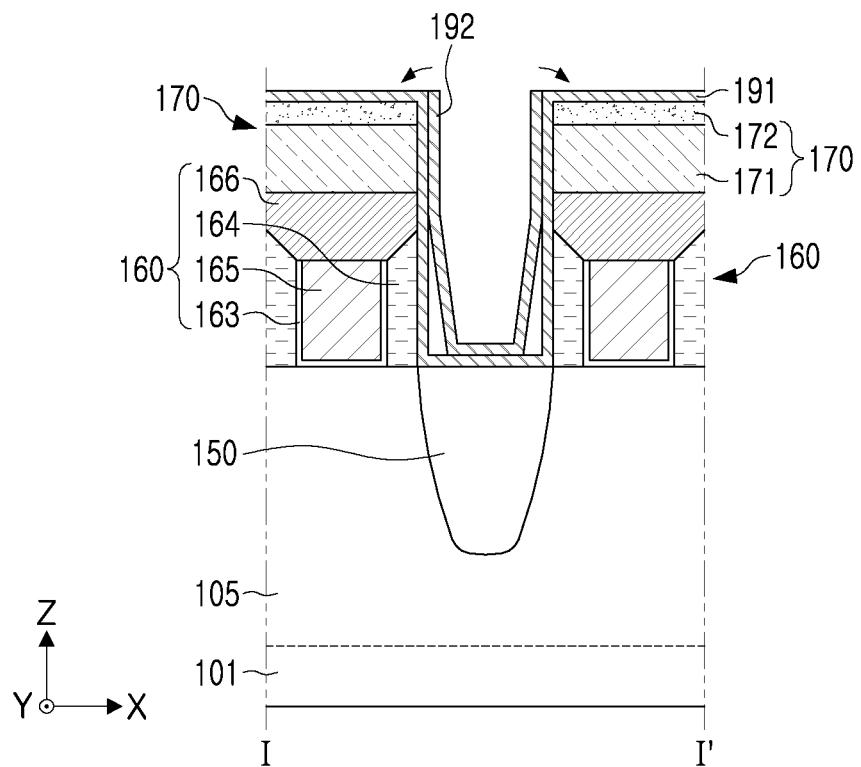

As a result, as illustrated in FIG. 10I, the second insulating film 192 inside the opening H may be inclined onto the first insulating film 191. Accordingly, the upper portion of a side surface of the first insulating film 191 and the upper portion of a side surface of the second insulating film 192 overlap, and the air gap 193 (FIG. 2A) may be formed to be surrounded by side and lower surfaces of the first insulating film 191 and a side surface of the second insulating film 192. The air gap 193 may overlap a portion in which the dummy oxide layer 194 has been present in the opening H. The inclination of the second insulating film 192 toward the first insulating film 191 is caused by self-alignment due to relaxation of stress having been present in the first and second insulating films 191 and 192, and a separate process for aligning the insulating film is not required. Accordingly, in the manufacturing method according to some embodiments, an air gap may be formed between adjacent structures in semiconductor devices having various structures, without an additional process, and thus, it may be advantageous for process application by reducing process complexity and cost increase. In addition, in the case of a related art method of forming an air gap by capping after removing the spacers through etching and photo processes, there is a limit to the formation of a uniform air gap because the capping material flows into the air gap. However, according to some embodiments, since the insulating film is self-aligned due to the removal of the dummy oxide layer and the resulting stress relief and thus the air gap is formed, a uniform air gap may be formed, and there is almost no risk of impurity inflow into the air gap.

The overlapping portion of the first and second insulating films 191 and 192 may extend downwardly from the upper portion of the sacrificial layer 170. In the example embodiment illustrated in FIG. 10I, the side overlapping portion of the first and second insulating films 191 and 192 extends downwardly to a level higher than the upper surface of the gate electrode 165, but the present inventive concept is not limited thereto. The overlapping portion of the first and second insulating films 191 and 192 may extend downwardly to the same level as the upper surface of the gate electrode 165, or the side overlapping portion of the first and second insulating films 191 and 192 may extend downwardly to the level lower than the upper surface of the gate electrode 165. As a result, the air gap 193 may extend in the Z direction to a level higher than the upper surface of the gate electrode 165 (see FIG. 3), or extend in the Z direction to the same level as the upper surface of the gate electrode 165 (see FIG. 4), or extend in the Z direction to a level lower than the upper surface of the gate electrode 165 (see FIG. 5). Also, the second insulating film 192 may be inclined onto the first insulating film 191 while maintaining a flat surface, or the second insulating film 192 may be inclined onto the first insulating film 191 in the form of a curved surface (refer to FIG. 9).

Figure 10J:
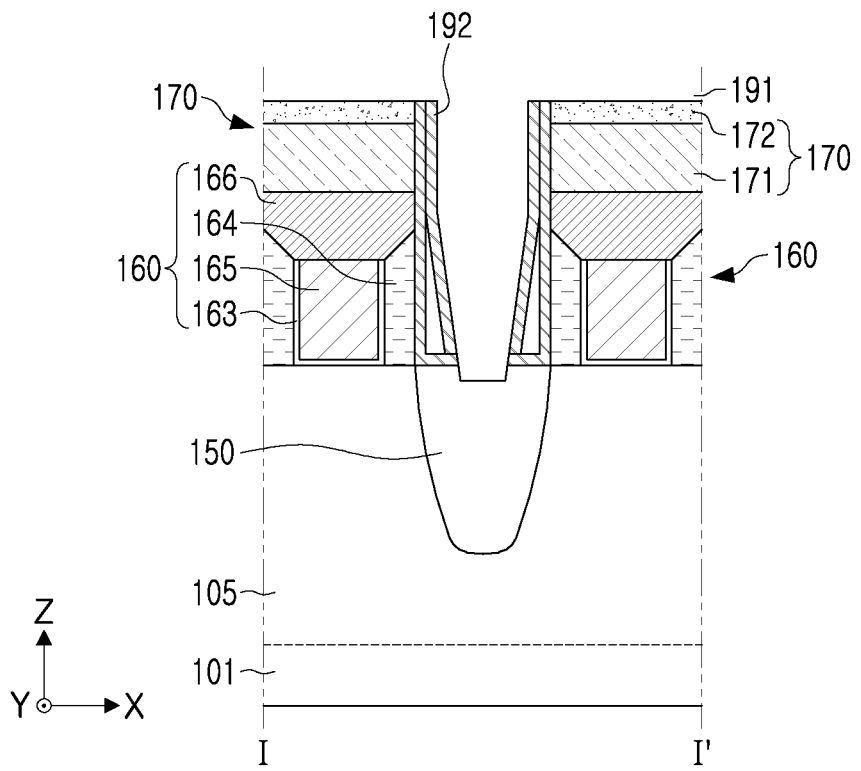

Next, referring to FIG. 10J, at least a portion of the first and second insulating films 191 and 192 formed on the lower surface of the opening H may be etched to expose at least a portion of the source/drain region 150. Along with the etching of the lower surfaces of the first and second insulating films 191 and 192, a portion of the source/drain region 150 is etched together such that the etched upper surface of the source/drain region 150 becomes lower than the upper surface of the active region 105, but the present inventive concept is not limited thereto. The exposed upper surface of the source/drain region 150 may be coplanar with the upper surface of the active region 105.

Figure 10K:
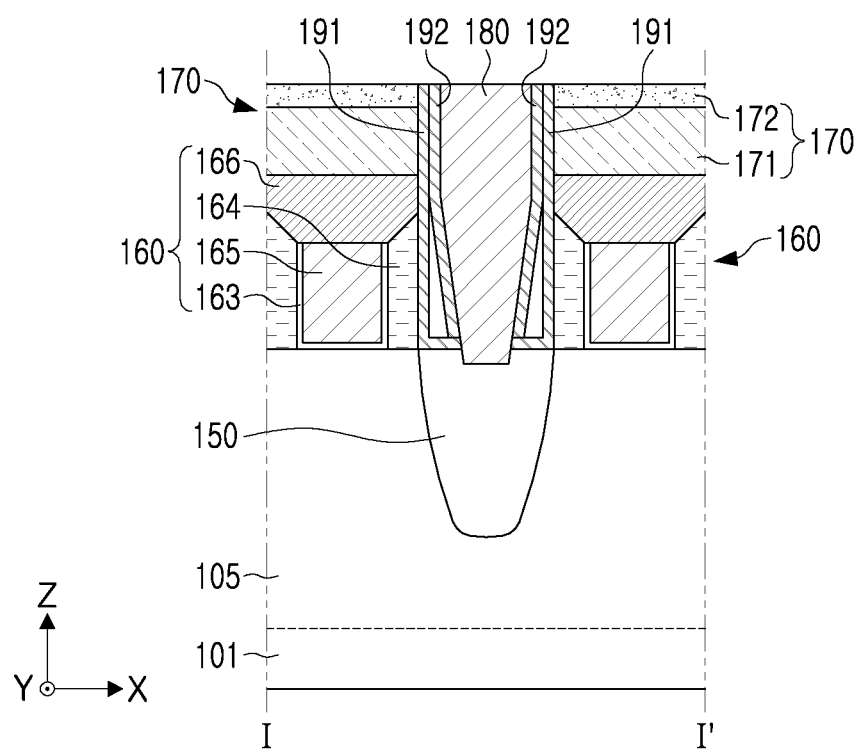

Next, referring to FIG. 10K, the contact plug 180 may be formed inside the opening H. The contact plug 180 may be connected (e.g., electrically connected) to the source/drain region 150 by penetrating through lower surfaces of the first and second insulating films 191 and 192, and may apply an electrical signal to the source/drain region 150. The contact plug 180 may be disposed in a region in which the source/drain regions 150 are recessed to a predetermined depth, and a side surface of the contact plug 180 may contact a side surface of the second insulating film 192. The contact plug 180 may have an inclined side surface in which a lower width is narrower than an upper width in the X-Z cross-section, but the configuration is not limited thereto.

Next, the sacrificial layer 170, upper and side surfaces of the first and second insulating films 191 and 192, and the upper portion of the contact plug 180 may be removed by chemical mechanical polishing (CMP). As a result, as illustrated in FIG. 2A, the semiconductor device 100 including the air gap 193 between the contact plug 180 and the adjacent gate structure 160 may be manufactured. The size, shape, and location of the air gap 193 may be controlled according to the relative thicknesses of the first and second insulating films 191 and 192 and the dummy oxide layer 194.

FIGS. 10A to 10K illustrate a method of manufacturing a semiconductor device having a structure including a single triangular air gap, but the number, shape and the like of the air gaps are not limited thereto. For example, to implement the example embodiment illustrated in FIGS. 7A and 7B, an empty space may be formed between the first insulating film 191 and the gate structure 160. In addition, to implement the example embodiment illustrated in FIGS. 8A and 8B, insulating films may be additionally disposed in addition to the first and second insulating films 191 and 192, and a dummy oxide layer disposed between the insulating films may be additionally disposed.

As set forth above, according to example embodiments, by controlling the structure of an insulating film and the shape of an air gap, a semiconductor device having improved electrical characteristics may be provided.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
   a substrate in which an active region extending in a first direction is defined;
   a gate structure extending in a second direction while intersecting the active region, on the substrate, the gate structure including a gate electrode, a gate spacer layer on a side surface of the gate electrode, and a gate capping layer on the gate electrode;
   a source/drain region on the active region, on at least one side of the gate structure;
   a contact plug on the source/drain region; and
   first and second insulating films between the contact plug and the gate structure and defining an air gap,
   wherein the first insulating film includes a first surface, and a second surface extending from the first surface while forming a first angle,
   wherein the second insulating film includes a third surface forming a second angle with the first surface of the first insulating film,
   wherein the second angle is an acute angle narrower than the first angle, and
   wherein the air gap is defined by the first surface, the second surface, and the third surface.

2. The semiconductor device of claim 1, wherein the first angle is substantially 90°.

3. The semiconductor device of claim 1, wherein the third surface and the second surface form a third angle narrower than the second angle.

4. The semiconductor device of claim 1, wherein an upper end of the air gap is at a level higher than an upper surface of the gate electrode.

5. The semiconductor device of claim 1, wherein the first angle is an obtuse angle.

6. The semiconductor device of claim 1,
   wherein the air gap comprises a first air gap, and
   wherein the semiconductor device further comprises a second air gap between the first insulating film and the gate structure.

7. The semiconductor device of claim 6, wherein shapes of the first and second air gaps are different from each other.

8. The semiconductor device of claim 6, wherein each of the first and second air gaps has a triangular shape in which an upper width is narrower than a lower width.

9. The semiconductor device of claim 6, wherein the first insulating film has a slope different from a slope of a side surface of the gate structure.

10. The semiconductor device of claim 1, wherein the third surface of the second insulating film has a curved shape that is convex in a direction toward the first insulating film.

11. The semiconductor device of claim 1, wherein the first insulating film and the second insulating film include at least one of silicon carbide (SiC), silicon nitride (SiN), silicon oxide (SiO), silicon carbonitride (SiCN), silicon oxycarbide (SiOC), or silicon oxycarbonitride (SiOCN).

12. The semiconductor device of claim 1, wherein an oxygen concentration in an upper portion of the second insulating film is higher than an oxygen concentration in a lower portion of the second insulating film.

13. A semiconductor device comprising:
an active region extending in a first direction on a substrate;
a plurality of channel layers spaced apart from each other vertically on the active region;
a gate structure intersecting the active region and the plurality of channel layers, on the substrate, and extending in a second direction, the gate structure surrounding the plurality of channel layers;
a source/drain region on the active region, on at least one side of the gate structure, and in contact with the plurality of channel layers;
a contact plug electrically connected to the source/drain region; and
an air gap structure between the gate structure and the contact plug, and including an air gap,
wherein the air gap is defined by a first surface, a second surface, and a third surface of the air gap structure,
wherein the first surface and the second surface form a first angle,
wherein the first surface and the third surface form a second angle narrower than the first angle, and
wherein the second surface and the third surface form a third angle narrower than the second angle.

14. The semiconductor device of claim 13, wherein the first angle is substantially 90°.

15. The semiconductor device of claim 13,
wherein the air gap comprises a first air gap, and
wherein the air gap structure further comprises a second air gap spaced apart from the first air gap, between the gate structure and the first air gap.

16. The semiconductor device of claim 15,
wherein the air gap structure further comprises first and second insulating films,
wherein the second air gap is defined by a fourth surface, a fifth surface, and a sixth surface of the air gap structure,
wherein the fourth surface and the fifth surface form a fourth angle,
wherein the fourth surface and the sixth surface form a fifth angle narrower than the fourth angle, and
wherein the fifth surface and the sixth surface form a sixth angle narrower than the fifth angle.

17. A semiconductor device comprising:
a substrate;
a gate structure on the substrate;
a source/drain region on the substrate and adjacent the gate structure;
a contact plug on the source/drain region; and
first and second insulating films between the contact plug and the gate structure and defining an air gap,
wherein the first insulating film includes first and second surfaces that converge at a first angle,
wherein the second insulating film includes a third surface that converges with the first surface of the first insulating film at a second angle,
wherein the second angle is an acute angle narrower than the first angle, and
wherein the air gap is defined by the first surface, the second surface, and the third surface.

18. The semiconductor device of claim 17, wherein the air gap comprises a triangular shape when viewed in a cross-sectional view.

19. The semiconductor device of claim 18,
wherein the gate structure comprises a first gate structure,
wherein the semiconductor device further comprises a second gate structure, and
wherein, when viewed in the cross-sectional view, the air gap is between the first and second gate structures.

20. The semiconductor device of claim 19,
wherein, when viewed in the cross-sectional view, the contact plug is between the first and second gate structures,
wherein the air gap comprises a first air gap,
wherein the semiconductor device further comprises a second air gap, and
wherein, when viewed in the cross-sectional view, the first and second air gaps are between the contact plug and the first gate structure.

* * * * *